United States Patent [19] [11] 4,334,951
Wagner [45] Jun. 15, 1982

[54] FABRICATION TECHNIQUE FOR THE PRODUCTION OF DEVICES WHICH DEPEND ON MAGNETIC BUBBLES

[75] Inventor: Richard S. Wagner, Bernardsville, N.J.

[73] Assignee: Bell Telephone Laboratories, Incorporated, Murray Hill, N.J.

[21] Appl. No.: 285,848

[22] Filed: Jul. 22, 1981

Related U.S. Application Data

[63] Continuation of Ser. No. 129,564, Mar. 12, 1980, abandoned.

[51] Int. Cl.$^3$ .......... C23F 1/02; G11C 11/14

[52] U.S. Cl. .......... 156/643; 156/653; 156/656; 156/657; 204/192 E; 427/131

[58] Field of Search .......... 204/192 E, 192 EC; 156/643, 646, 652, 653, 656, 657, 659; 427/58, 127–132

[56] References Cited

U.S. PATENT DOCUMENTS

| | | | |
|---|---|---|---|
| 3,957,552 | 5/1976 | Ahn et al. | 156/11 |
| 4,098,917 | 7/1978 | Bullock et al. | 427/36 |
| 4,172,758 | 10/1979 | Bailey et al. | 156/643 |
| 4,208,241 | 6/1980 | Harshbarger et al. | 156/643 |
| 4,238,277 | 12/1980 | Bril | 156/643 |
| 4,272,348 | 6/1981 | Cox et al. | 204/192 E |
| 4,299,680 | 11/1981 | Fontana, Jr. et al. | 204/192 E |

*Primary Examiner*—Aaron Weisstuch
*Attorney, Agent, or Firm*—Bruce S. Schneider

[57] ABSTRACT

Magnetic bubble devices having planar geometry are produced by a particular sequence of processing steps. This sequence of processing steps includes the sequential deposition on a garnet material of an insulating material, an electrically conductive material, a second insulating material, and a material such as permalloy. The upmost layer is then patterned by conventional techniques. The pattern thus produced is used as a mask and the exposed underlying insulating layer is removed. The exposed metal conducting layer is then patterned and etched in a pattern different from that of the permalloy and second insulating layers by a process such as selective plasma etching that does not substantially degrade the exposed dielectric material or the permalloy. The results are a device with layers having planar geometry.

8 Claims, 3 Drawing Figures

FABRICATION TECHNIQUE FOR THE PRODUCTION OF DEVICES WHICH DEPEND ON MAGNETIC BUBBLES

This is a continuation of application Ser. No. 129,564, filed Mar. 12, 1980, now abandoned.

BACKGROUND OF THE INVENTION

1. Field of the Invention

This invention relates to the fabrication of devices relying on magnetic properties and, more particularly, to the fabrication of devices relying on uniaxial anisotropy in a garnet layer.

2. Art Background

Devices relying on magnetic properties often require the deposition of a metal film during their fabrication. For example, in the case of magnetic bubble devices, i.e., devices based on uniaxial magnetic domains, in aluminum alloy is deposited on a silicon dioxide layer that, in turn, overlays the magnetic garnet epilayer. These metallic films are patterned to produce a desired result in a localized area of the device. In the example of magnetic bubble devices, the aluminum alloy does not cover the entire silicon dioxide layer, but is confined to areas where control functions are performed, e.g., the metal film is patterned to induce bubble nucleation, replication or transfer in a particular area of the magnetic garnet film at a given instant in time.

Since the metallic films utilized are not continuous, but are localized in particular areas of the devices, subsequent deposited layers will not fill in the steps produced by this localization. Thus, continuing the example of magnetic bubble devices, if a second insulating layer, e.g., another layer of silicon dioxide is deposited over the aluminum alloy, this silicon dioxide layer will not be planar, but will have depressions in areas where the underlying aluminum alloy is absent. Subsequently a material such as permalloy which will be patterned in a configuration suitable for controlling domain propagation is deposited onto this second insulating layer. The domain propagation control layer thus formed is, in turn, non-planar.

This non-planar structure, although usually unimportant in semiconductor devices, often becomes significant in devices which rely on magnetic properties. Since magnetization is a three dimensional effect, a film that is not planar experiences magnetic gradients through its cross-section. For example, as discussed in the case of magnetic bubble devices, if a permalloy alloy is deposited on a stepped silicon dioxide film, this permalloy alloy is similarly non-planar. When magnetic fields are introduced to operate the device, various areas of the permalloy strip experience spurious magnetic effects. This results in a degree of device unreliability. (See, for example, W. Strauss, *Journal of Applied Physics,* 49 pp. 1897–1899, March (1978).)

In addition to the reliability problems described above, other difficulties often are encountered. For example, after the permalloy layer is deposited, it must be patterned. This patterning is typically done by exposing through a mask a layer of photoresist deposited on the permalloy. The mask used to produce this patterned feature must be registered relative to the pattern of the underlying metallic structures. Typically, the mask must be moved several times to achieve this registration. Each movement of the mask results in abrasion between the photoresist and the mask. This abrasion induces defects in the photoresist and in the permalloy pattern it defines, causing reduced reliability of the device.

Additionally, after the deposition of the initial insulating layer, e.g., silicon dioxide, and the overlying metal layer, the garnet with its deposited layers must be removed from the deposition apparatus in order to etch the metal to form the desired pattern for functions such as replication. After this etching is completed, a second insulating layer and a layer for controlling propagation are deposited. However, invariably some foreign matter is introduced between the metal layer and subsequently deposited layers. To improve yield and reliability, it is desirable to minimize this contamination problem.

SUMMARY OF THE INVENTION

By following a particular set of processing steps, a device is fabricated which is planar in geometry. To achieve this result, a garnet substrate is treated by sequentially depositing a layer of an insulating material such as silicon dioxide, a conducting material such as aluminum/copper alloy, a second layer of insulating material, and a layer of material that is employed to control domain propagation in the garnet, e.g., a soft magnetic material such as permalloy. The propagation control material is then etched into a desired pattern by conventional techniques. The pattern formed in the propagation control layer is used as a mask for removing the exposed portion of the underlying second insulating layer by techniques such as plasma etching. The remaining portion of the second insulating layer is only that area that underlies the propagation control pattern. The exposed portion of the metallic layer is then patterned using an etchant that does not substantially degrade the propagation control material. If desired, the device is then passivated by deposition of a suitable material, e.g., silicon dioxide.

Since all the deposition steps are done before any further processing is required, interfacial contamination is reduced and since all the layers are deposited before etching, all layers of the device are planar. In the subject invention, unlike in prior processes, first the propagation control layer and later the metallic layer are patterned. Since the pattern of the metallic layer is considerably simpler than that of the propagation layer, the registration of the metallic pattern mask to the propagation layer pattern is not difficult and reliability and yield degradation due to such registration is reduced.

DETAILED DESCRIPTION

Figure 1:
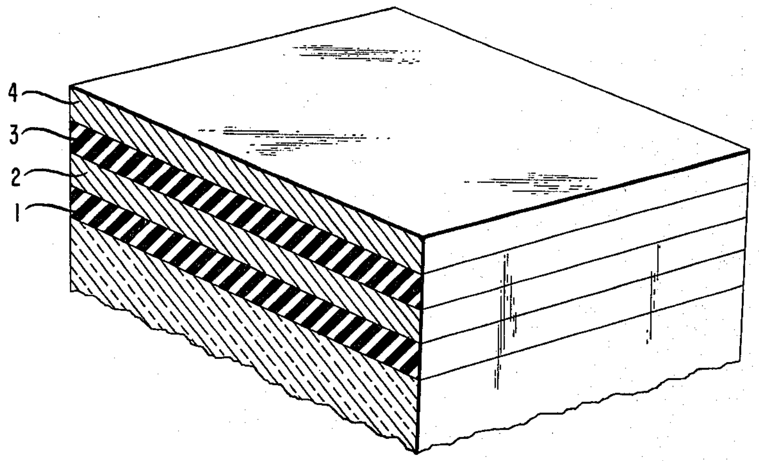
FIGS. 1–3 illustrate stages in the practice of the subject inventive process.

The inventive process is initiated by deposition on a material capable of supporting magnetic domains. Typically, this deposition substrate is an epitaxial layer of a material having a garnet crystal structure such as $Y_1Sm_{0.5}Lu_{0.7}Ga_{0.8}Ge_{1.8}Fe_{4.2}O_{12}$. The composition of the material which supports the magnetic domains is not critical. As shown in FIG. 1, typically four layers are sequentially deposited onto this magnetic domain supporting material. The first layer, 1, is a layer of a material which is an insulator. This layer generally is used to reduce strain between the metallic layer and the garnet substrate. Although the use of this layer is employed in the preferred embodiment, it is not essential to the subject invention and it is possible to omit this insulating layer. The particular insulator utilized also is not critical. The first insulating layer, 1, should be sufficiently adherent to the underlying magnetic domain supporting material so that separation does not occur. Typically, a layer of silicon dioxide is employed.

After deposition of the insulating layer, a layer of electrically conducting material, 2, is deposited. (When a first insulating layer is not used, the metallic layer is deposited directly on the garnet.) This layer of electrically conducting material is ultimately formed into patterns suitable for performing processing functions such as nucleation and detection of magnetic domains in the garnet material. Since these functions are performed by applying an electrical signal to the conducting pattern, the resistivity of the material should be sufficiently low and the thickness of the layer should be sufficiently thick such that excessive resistance does not hamper the control processes. Resistivities in the range 1.6 to $3\times10^{-6}$ to ohm-cm, together with layer thicknesses in the range 0.05 to 1.0 μm, preferably 2000 to 6000 Angstroms, are generally employed for conventional patterns in the conducting layer. A typical material for use as this layer is an aluminum/copper alloy, in particular, an aluminum/copper alloy having constituents in the range of 96 percent aluminum 4 percent copper to 99 percent aluminum 1 percent copper.

A second insulating layer, 3, having similar properties as discussed previously for the first insulating layer is deposited on the conducting layer. Then, a layer of material, 4, that is ultimately patterned into structures which control propagation of the uniaxial magnetic domains in the garnet material is deposited on this second insulating layer. Typically, this propagation control material is a soft magnetic material such as permalloy or a conductor for use in dual conductor propagation of uniaxial magnetic domains. (See Bobeck et al, *Bell System Technical Journal,* Vol. 58, 1453, July, 1978.)

The thicknesses of and the means for depositing the various layers are generally not critical. However, as discussed, the thicknesses of the second insulating layer should be sufficient to produce the desired electrical insulation between the conducting layer and the propagation control layer. Advantageously, the first and second insulating layers should be made of sufficient thickness so that the metal conducting layer and the propagation control layer are between 0.05 μm and 0.5 μm and between 0.2 μm and 1 μm, respectively, from the domain supporting material. As discussed, the metal conducting layer should be sufficiently thick so that the current applied does not cause degradation. In satisfying the spacing requirements, the thickness of the metal conducting layer must be considered. For practical applications, thicknesses of the first and second insulating layers are usually in the range 0.05 μm and 0.5 μm and 0.05 μm to 0.5 μm, respectively. The thickness of the propagation control layer is not critical and is generally in the range 0.05 μm to 0.5 μm. Conventional techniques, such as plasma and sputter deposition, are used to deposit the insulating layer material such as $SiO_2$, the metal layer material such as Cu/Al alloy, and the propagation control layer material such as permalloy. (See, for example, Bobeck et al, supra, and D. C. Bullock et al, "Magnetic Bubble Device Processing and Pickax Circuit Design," *IEEE Transactions on Magnetics,* 12, pp. 654–656, November, 1976, for typical techniques.)

After deposition, the structure is treated to produce the desired patterns in the propagation control and the metal conducting material. This processing requires that the propagation control layer first be patterned in a configuration which is suitable for the propagation of magnetic domains in the underlying garnet materials. (Typical patterns are described in P. I. Bonyhard et al, "Magnetic Bubble Memory Chip Design," *IEEE Transactions on Magnetics,* 9, pp. 433–436, September, 1973.) The patterning of the material is done by conventional techniques. For example, if permalloy is used, the material is processed by ion milling as described in D. C. Bullock et al, supra. If a dual conductor technology is utilized, the metal layer employed is processed by ion milling or plasma etching as described in Bobeck et al, supra. After the propagation control layer, 4, has been patterned, the underlying insulating layer which is exposed, i.e., that area of the insulating material, 3, which does not underlie the propagation control material left after patterning, is treated. (The propagation control layer functions, in effect, as a mask during etching the second insulating layer.) This treatment involves the removal of the exposed insulating material, 3, without degrading the patterned propagation control layer and is done by conventional techniques. For example, in the case of a silicon dioxide insulating material and a permalloy propagation control layer, the silicon dioxide to be removed is in a preferred embodiment etched by plasma etching and most preferably by using a fluorine reactive specie. (See D. C. Bullock et al, supra, for suitable gases and conditions useful for the etching of silicon dioxide by the plasma technique without substantially degrading the permalloy.)

Figure 2:
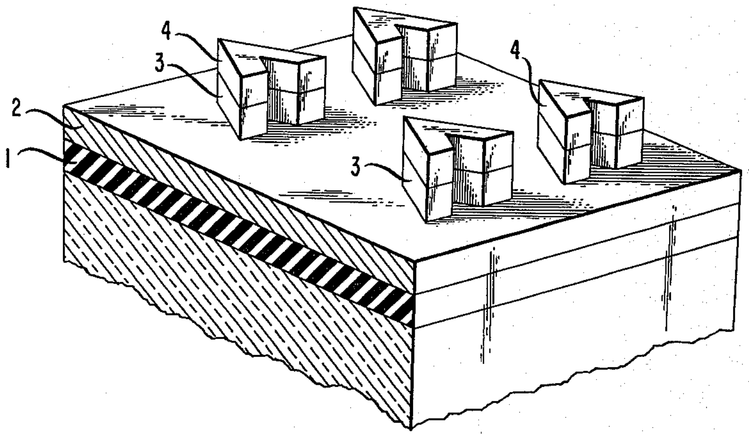
Figure 3:
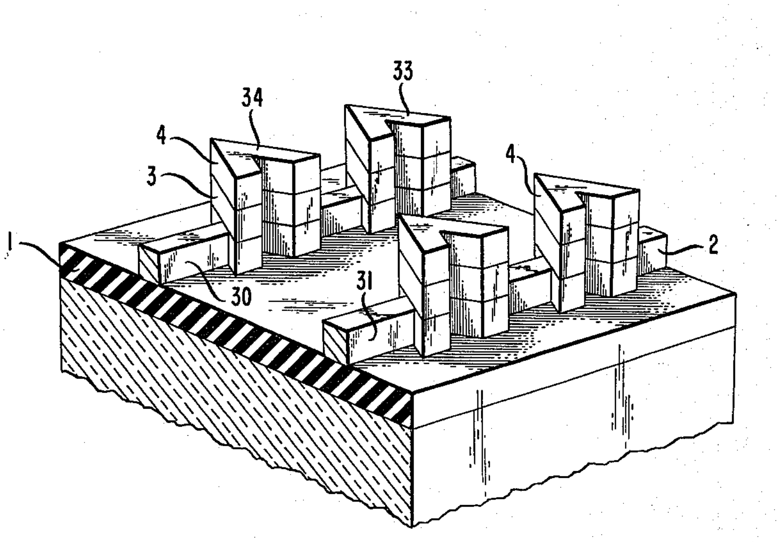

After the silicon dioxide is etched, configurations such as shown in FIG. 2 are obtained. As can be seen a substantial portion of the underlying metallic conducting layer, 2, is exposed. This exposed portion is then patterned to produce the desired structures, such as nucleators and replicators, again without substantially degrading the propagation control layer. The patterning is done by conventional techniques such as photolithography followed advantageously by plasma etching with a reactive specie such as chlorine. (See Bobeck et al, supra.) In a preferred embodiment, the metallic layer and the propagation control layer have different compositions to facilitate etching the former without degrading the latter. The patterns in the metal layer to an extent are interrupted by the portions which are not etched, i.e., the portions which are directly under the pattern of the propagation control layer. Thus, structures as shown in FIG. 3 are obtained by the subject invention. It has been found that these pattern distortions are generally unimportant and the functions served by the metallic layer are essentially undisturbed. However, one easily satisfied precaution is necessary. If two portions of the metallic layer are to be electrically isolated, they must not be formed to pass under the same feature of the permalloy pattern. For example, if features 30 and 31 are to be isolated, they must not both pass under features 33 or 34 (FIG. 3).

If desired, it is possible to passivate the device produced. This is done by depositing a suitable material such as silicon dioxide over the entire device so that the voids left from the processing are entirely filled. Conventional techniques such as plasma or sputter deposition are employed to produce this passivation.

I claim:

1. A process for fabricating a device comprising a substrate material of garnet structure capable of supporting a uniaxial magnetic domain, a patterned uniaxial magnetic domain propagation control layer, a patterned metallic layer between said garnet substrate and said patterned propagation control layer, and a patterned insulating layer between said patterned metallic layer and said patterned propagation control layer, said process comprising the steps of depositing said layers in sequence in overlying relation to said substrate and then sequentially patterning said propagation control layer, said insulating layer, and said metallic layer characterized in that said propagation control layer is first patterned, said patterned propagation control layer is used as a mask to etch said insulating layer and then said metallic layer is delineated in a pattern different from that of said propagation control layer.

2. The process of claim 1 wherein said propagation control layer comprises permalloy.

3. The process of claim 1 wherein said metallic layer comprises an aluminum alloy.

4. The process of claim 1 wherein said aluminum alloy comprises between 96 and 99 percent aluminum.

5. The process of claim 1 wherein said insulating layer comprises silicon dioxide.

6. The process of claim 1 wherein said metallic layer is patterned by reactive plasma etching.

7. The process of claim 6 wherein the reactive specie used in said plasma etching is chlorine.

8. The process of claim 1 wherein said device is passivated with silicon dioxide.

* * * * *

UNITED STATES PATENT AND TRADEMARK OFFICE

CERTIFICATE OF CORRECTION

PATENT NO. : 4,334,951

DATED : June 15, 1982

INVENTOR(S) : Richard S. Wagner

It is certified that error appears in the above—identified patent and that said Letters Patent is hereby corrected as shown below:

In the specification, Column 1, line 19 "in" should read --an--. Column 3, line 19 "$3x10^{-6}$ to ohm-cm" should read --$3x10^{-6}$ ohm-cm--.

In the claims, Claim 1, Column 5, line 1 "garnet substrate" should read --garnet substrate material--.

Signed and Sealed this

*Twenty-first* Day of *December 1982*

[SEAL]

*Attest:*

GERALD J. MOSSINGHOFF

*Attesting Officer* *Commissioner of Patents and Trademarks*